(12) United States Patent
Zhang

(10) Patent No.: US 10,069,489 B2
(45) Date of Patent: Sep. 4, 2018

(54) MULTIPLEXER BASED FREQUENCY EXTENDER

(71) Applicant: Cemin Zhang, Diamond Bar, CA (US)

(72) Inventor: Cemin Zhang, Diamond Bar, CA (US)

(73) Assignee: Cemin Zhang, Diamond Bar, CA (US)

( * ) Notice: Subject to any disclaimer, the term of this patent is extended or adjusted under 35 U.S.C. 154(b) by 0 days.

(21) Appl. No.: 15/598,003

(22) Filed: May 17, 2017

(65) Prior Publication Data
US 2018/0145666 A1 May 24, 2018

(30) Foreign Application Priority Data

Nov. 22, 2016 (CN) .......................... 2016 1 1046245

(51) Int. Cl.
*H03B 19/06* (2006.01)
*H03K 5/00* (2006.01)
*H03K 21/02* (2006.01)

(52) U.S. Cl.
CPC ....... *H03K 5/00006* (2013.01); *H03K 21/026* (2013.01)

(58) Field of Classification Search
CPC .................. H03K 5/00006; H03K 21/026
USPC .......................................................... 327/118
See application file for complete search history.

(56) References Cited

U.S. PATENT DOCUMENTS 2,945,997 A * 7/1960 Kennedy .................. H02P 8/00 318/685
3,613,094 A * 10/1971 Giles ........................ G01S 1/02 342/202
5,420,529 A 5/1995 Guay et al.
6,147,525 A * 11/2000 Mitani ............... H03K 5/00006 327/116
6,310,509 B1 10/2001 Davenport et al.
(Continued)

OTHER PUBLICATIONS

Kumari et al, "Programmable Frequency Divider Design for Multi—Ghz Phase Locked Loop (PLL) System", posted at International Journal of Electronic and Electrical Engineering, available from Internet, <URL: http://www.ripublication.com/irph/ijeee_spl/ijeeev7n9_15.pdf>, posting date Nov. 9, 2014 (6 pgs).
(Continued)

Primary Examiner — Ryan Jager
(74) Attorney, Agent, or Firm — North Weber & Baugh LLP

(57) ABSTRACT

The disclosure discloses a multiplexer based frequency extender comprising a preamplifier to receive a RF input signal and output a pre-amplified RF signal, at least one frequency multiplier or at least one frequency divider, and a multiplexer. The multiplexer comprises multiple differential pairs, each differential pair comprises a corresponding bias current control circuit that switches ON or OFF a bias current flowing through a corresponding differential pair. The at least one frequency multiplier or the at least one frequency divider receives the pre-amplified RF signal and outputs a frequency-multiplied RF signal or a frequency-divided signal. The multiplexer couples to receive the pre-amplified RF signal, the frequency-multiplied RF signal and/or the frequency-divided signal, the multiplexer selects a signal from the received signals and outputs based on the selected signal a multiplexer output signal.

18 Claims, 3 Drawing Sheets

(56) References Cited

U.S. PATENT DOCUMENTS

| | | | | |
|---|---|---|---|---|
| 6,385,214 B1 * | 5/2002 | Kikuchi | ............... | H03K 17/162 |
| | | | | 327/407 |
| 7,602,877 B2 * | 10/2009 | Shimada | ............... | H03K 23/42 |
| | | | | 327/115 |
| 8,126,079 B1 * | 2/2012 | Tran | ............... | H03L 7/22 |
| | | | | 327/157 |
| 8,797,069 B2 * | 8/2014 | Hesen | ............... | H03K 21/12 |
| | | | | 327/115 |
| 8,928,369 B1 * | 1/2015 | Jaeger | ............... | H03K 5/15006 |
| | | | | 327/115 |
| 2008/0258781 A1 | 10/2008 | Song et al. | | |
| 2009/0189741 A1 * | 7/2009 | Rowland | ............... | A61B 5/0031 |
| | | | | 340/10.4 |
| 2009/0256596 A1 * | 10/2009 | Oh | ............... | G06F 7/68 |
| | | | | 327/115 |
| 2017/0155414 A1 * | 6/2017 | Selvanayagam | ...... | H03F 1/0205 |
| 2017/0309164 A1 * | 10/2017 | Rowland | ............... | G08C 17/02 |

OTHER PUBLICATIONS

Product: HMC862ALP3E. Available from Internet, <URL: http://www.analog.com/en/products/rf-microwave/frequency-dividers-multipliersdetectors/frequency-dividers-prescalers-counters/HMC862A.html#product-overview/> (4pgs).

Product: UXD20K. Available from Internet, <URL: https://www.microsemi.com/existing-parts/parts/137522#resources/>.

* cited by examiner

MULTIPLEXER BASED FREQUENCY EXTENDER

CROSS-REFERENCE TO RELATED APPLICATIONS

This application claims foreign priority to Chinese Patent Application No. 201611046245.3, entitled "A Multiplexer Based Frequency Extender," naming Cemin Zhang as inventor, and filed Nov. 22, 2016, the subject matter of which is hereby incorporated herein by reference.

BACKGROUND

Field of Invention

The invention relates to frequency source technologies, in particular, to a multiplexer based frequency extension device.

Background of Invention

Radio Frequency (RF) or Microwave circuit applications often involve the extension of frequency coverage, that is, the need to extend the frequency to a higher frequency or to a lower frequency. Existing frequency extension systems usually have disadvantages of complicated circuit structure, bulky circuit size, large power consumption and high cost. Besides, existing frequency extension systems may also have issues such as serious interference between different output frequencies, difficult to switch to a different frequency spectrum, and difficult to integrate, thus making it very challenging for practical application.

DESCRIPTION OF INVENTION

It is an object of the present invention to overcome the shortcomings of the prior art and to provide a multiplexer based frequency extender which is simple in structure, convenient in switching, robust in anti-interference, low power consumption, low cost, small in size, easy to integrate and popularize.

The invention solves the above-mentioned problems mainly through the following technical scheme: a multiplexer based frequency extender comprises a preamplifier, a multiplexer, wherein the multiplexer comprises multiple differential pairs, each differential pair couples to a corresponding bias current control circuit that switches ON or OFF a bias current flowing through the differential pair; each differential pair includes an input port of the multiplexer and an output port for a differential signal, said differential signal output port couples to an output port of the multiplexer; the multiplexer couples to at least one frequency multiplier (or one frequency divider), when there are multiple frequency multipliers (or frequency dividers), the multiple frequency multipliers (or frequency dividers) are coupled in series, each output port of the frequency multiplier (or frequency divider) couples to a corresponding multiplexer input port; the output port of the preamplifier couples to a unique input port of the multiplexer and to the input port of the first frequency multiplier (or frequency divider) respectively.

When the invention is applied, an RF input signal is input to and amplified by the preamplifier, which outputs a preamplified RF signal to the multiplexer and the frequency multiplier or the frequency divider. By incorporating with the preamplifier, the frequency extender of the present invention provides an improved sensitivity and dynamic range, an effective match with external peripheral circuitry and an enhanced driving ability to the following stages. While in use, only one differential pair is selected with its biasing current turned on by a corresponding bias current control circuit, the multiplexer selects the input signal fed to the selected differential pair. It is thus convenient for the multiplexer to select one RF input signal as basis for the RF output signal. In the present invention, each differential pair has a separate bias current control circuit, which is advantageous for RF input signal isolation between different differential pairs, and prevents non-selected RF input signals from interfering with the selected RF input signal.

Further, each said differential pair comprises two NPN transistors, the output port of the preamplifier, the input and output ports of the frequency multiplier (or frequency divider), and the input and output ports of the multiplexer are all differential ports having differential signal lines; the differential signal lines at each input port of the multiplexer respectively couple to base of two NPN transistors of a corresponding differential pair, the differential signal lines at the output port of the multiplexer couple to collectors of two NPN transistors of each differential pair; each of the differential signal lines at the output of the multiplexer couples to a DC voltage source via a load resistor, both emitters of two NPN transistors of each differential pair are tied together and coupled to a corresponding bias current control circuit. Thus, when the invention is implemented, an input RF differential signal received at an input port of the multiplexer is amplified by a differential pair of two NPN transistors, the amplified RF differential signal is output from the differential signal lines of the multiplexer output port.

Further, each differential signal line at the output port of the multiplexer is coupled to the DC voltage source via said load resistor and an inductor. The inductor is added to boost signal gain when operation frequency gets higher.

Further, each bias current control circuit comprises a NPN transistor, a NMOS field effect transistor (FET), a biasing resistor and a DC bias voltage source; the biasing resistor couples between an emitter of the NPN transistor and a drain of the NMOS FET, a base of the NPN transistor couples to the DC bias voltage source, a collector of the NPN transistor couples to one corresponding differential pair, a source of the NMOS FET is grounded, a logic trigger input signal is fed to a gate of the NMOS FET via a resistor, the logic trigger input signal controls ON or OFF states of the bias current control circuit with a logic high or low input voltage. While the invention is implemented, a bias current control circuit is turned on (or off) when its logic trigger input is set to a high (or low) voltage level, and thus turning ON (or OFF) the corresponding differential pair coupled to said bias current control circuit. Thus, the invention is convenient to switch ON or OFF a bias current through a differential pair. In the embodiment of present invention, each NMOS FET couples between GND and a biasing resistor, which is beneficial to improve the isolation between a logic trigger input signal and a differential RF signal. While in use, the size of each NPN transistor and NMOS FET, and the value of each biasing resistor can be optimized for each bias current control circuit, thus each differential pair can be biased at a different current level for selection and activation. It is thus possible to provide a larger (or smaller) turned on current when the multiplexer selects a differential pair with a relatively high (or low) frequency input signal, for optimizing the overall performance of the multiplexer based frequency extender.

Further, the multiplexer based frequency extender of present invention comprises a first decoder to generate logic trigger input signals for controlling each bias current control circuit of the multiplexer, and a second decoder to generate logic control signals for controlling ON or OFF states of the frequency multiplier or the frequency divider.

Further, the output port of the multiplexer is coupled to a back-end amplifier. By incorporating the back-end amplifier, the frequency extender of present invention provides an effective match with external peripheral circuitry and an improved output power level.

Further, the preamplifier comprises two fan-out buffers, the output ports of the two fan-out buffers are each coupled to the input port of the first frequency multiplier (or frequency divider) and one input port of the multiplexer respectively.

Further, as one embodiment of the present invention, the multiplexer comprises four input ports, the frequency extender has three frequency multipliers; each output port of the three frequency multipliers and the output port of the preamplifier are coupled to the four input ports of the multiplexer respectively. Thus in this embodiment, output frequencies of an input RF signal are extended to higher frequencies.

Further, as one embodiment of the present invention, the multiplexer comprises four input ports, the frequency extender has three frequency dividers; each output port of the three frequency dividers and the output port of the preamplifier are coupled to the four input ports of the multiplexer respectively. Thus in this embodiment, output frequencies of an input RF signal are extended to lower frequencies.

To sum up, the disclosed multiplexer based frequency extender is simple in structure, convenient in switching, robust in anti-interference, low power consumption and low number in components, making it small in size and convenient to implement for many applications.

BRIEF DESCRIPTION OF THE DRAWINGS

As a part of this application, the accompanying drawings described hereinafter are used to provide further understanding for the embodiments of the invention, and shall not constitute a restriction on said embodiments. Among the accompany drawings.

DETAILED DESCRIPTION OF PREFERRED EMBODIMENTS

The invention will now be described by the following embodiments and accompanying drawings to better elaborate its purposes as well as the advantages of its technical scheme. All the schematic implementation methods and their illustrations are only used to elaborate the invention, and shall not constitute a restriction on the invention.

Embodiment 1

Figure 1:
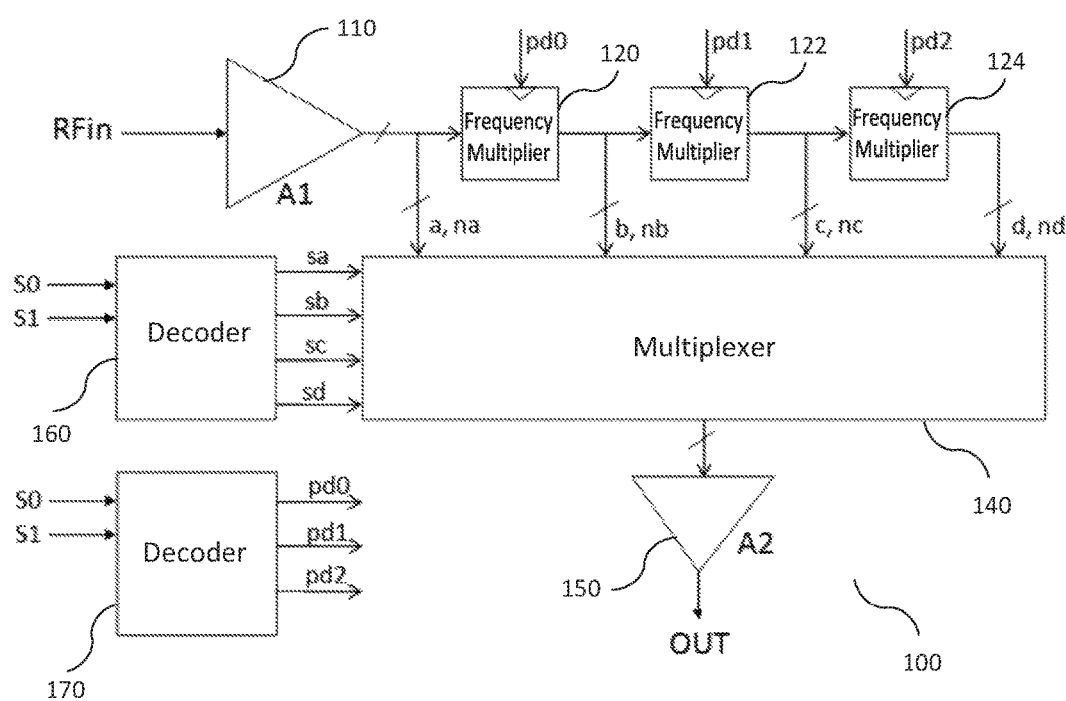
FIG. 1 is a block diagram of a first embodiment of the present invention.
Figure 2:
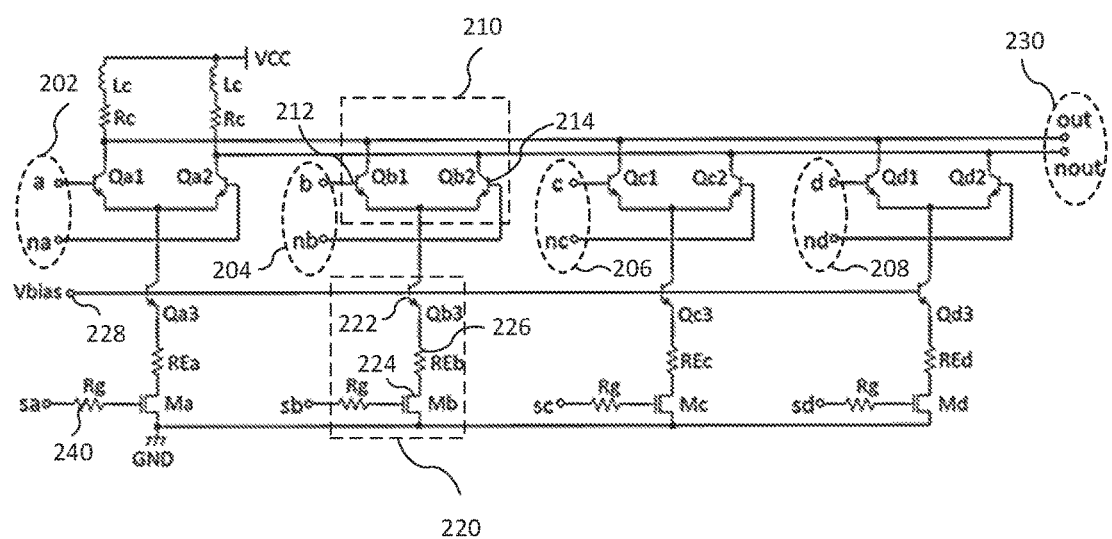
FIG. 2 is a detailed circuit schematic of the multiplexer shown in FIG. 1.

As shown in FIG. 1 and FIG. 2, a multiplexer based frequency extender 100 comprising: a preamplifier A1 110, a multiplexer 140 and a back-end amplifier A2 150, wherein the multiplexer comprises multiple differential circuits 210 with corresponding bias current control circuits 220, a DC voltage source VCC and a bias voltage source Vbias 228, the bias current control circuit switches ON or OFF a bias current flowing through a corresponding differential circuits 210. In this embodiment the multiplexer has four differential pairs, each differential circuits 210 couples to a corresponding bias current control circuit that switches ON or OFF a bias current flowing through the differential circuits 210. Each differential circuit 210 couples to an input port (202, 204, 206, or 208) of the multiplexer and has an output port for a differential signal, each of the four differential signal output ports couples to an output port 230 of the multiplexer. In this embodiment the multiplexer based frequency extender comprises three frequency multipliers 120, 122, and 124 coupled in series, the output ports of the three frequency multipliers couple to three input ports 204, 206, and 208 of the multiplexer respectively. The preamplifier A1 comprises two fan-out buffers, the output ports of the two fan-out buffers are each coupled to the input port of the frequency multiplier and a separate input port 202 of the multiplexer respectively, wherein the separate input port of the multiplexer does not couple to the frequency multiplier. The back-end amplifier A2 150 is coupled in series to the output port 230 of the multiplexer. This embodiment can be implemented on a planar monolithic substrate using silicon-based substrate materials.

In this embodiment, each said differential circuit 210 comprises a pair of NPN transistors 212 and 214; the output ports of the preamplifier A1, the input and output ports of the frequency multiplier, and the input and output ports of the multiplexer are all differential ports having differential signal lines; the differential signal lines at each input port of the multiplexer respectively couple to bases of two NPN transistors of a corresponding differential circuit 210, the differential signal lines 'out' and 'nout', at the output port of the multiplexer are coupled to collectors of two NPN transistors of each differential circuit 210; each of the differential signal lines at the output port of the multiplexer couples to a DC voltage source VCC via a load resistor Rc, both emitters of two NPN transistors of each differential circuit 210 are tied together and coupled to a corresponding bias current control circuit 220. In order to boost high frequency signal gain, an inductor Lc is added in series with the load resistor Rc, the inductor Lc is coupled between the load resistor Rc and the DC voltage source VCC. In the implementation of present embodiment, the output signal line 'out' of the multiplexer output port is coupled to the collectors of NPN transistors Qa1, Qb1, Qc1 and Qd1, the output signal line 'nout' of the multiplexer output port is coupled to the collectors of NPN transistors Qa2, Qb2, Qc2 and Qd2; Thus, in this embodiment each differential pair shares the same DC voltage source VCC, in addition, between all collectors of NPN transistors and the DC voltage source VCC, only two inductors Lc and two load resistors Rc are required, the total number of components are minimized.

In this embodiment, each bias current control circuit 220 comprises a NPN transistor 222, a NMOS field effect transistor (FET) 224, a biasing resistor 226 and a DC bias voltage source Vbias 228; the biasing resistor couples between an emitter of the NPN transistor and a drain of the NMOS FET, a base of the NPN transistor couples to the DC bias voltage source Vbias, a collector of the NPN transistor couples to one differential pair, a source of the NMOS FET is grounded, a logic trigger input signal is fed to a gate of the NMOS FET via a resistor Rg 240, the logic trigger input signal controls ON or OFF states of the bias current control circuit with a logic high or low voltage. The resistor Rg works as an isolation resistor, which helps to isolate the logic trigger signal from interfering input RF signals at differential pair, the value of Rg is set to 2KΩ in this embodiment.

The present embodiment further comprises a first decoder 160 to generate logic trigger input signals for controlling each bias current control circuit 220 of the multiplexer, and a second decoder 170 to generate logic control signals for controlling ON or OFF states of the frequency multiplier (or frequency divider). In the implementation of present embodiment, the first decoder 160 is a 2-4 decoder, two input ports s0 and s1 of the 2-4 decoder are used to input logic selection signals, four output ports sa, sb, sc and sd of the 2-4 decoder couple to four logic trigger input ports of the multiplexer respectively. The second decoder 170 generates logic control signals pd0, pd1 and pd2 which control the ON or OFF states of the three frequency multipliers.

In the implementation of present embodiment, an RF signal RFin (either a single-ended or a differential signal) is fed to the input port of preamplifier A1 110, the preamplifier A1 outputs a differential RF signal a/na, the differential RF signal a/na then drives the first stage of the frequency multiplier 120 and one input port 202 of the multiplexer respectively; the differential RF signal a/na drives the first stage of the frequency multiplier and outputs a differential RF signal b/nb, the differential RF signal b/nb then drives the second stage 122 of the frequency multiplier and outputs a differential RF signal c/nc, the differential RF signal c/nc drives the third stage 124 of frequency multiplier and outputs a differential RF signal d/nd. The differential RF signals a/na, b/nb, c/nc and d/nd are amplified by four differential pairs composed of NPN transistor pairs Qa1/Qa2, Qb1/Qb2, Qc1/Qc2 and Qd1/Qd2 respectively, the amplified differential RF signals then output from a differential signal line out/nout. NMOS FETs Ma, Mb, Mc and Md are NMOS switches wherein their switching ON or OFF states are determined by the logic control voltage levels from the 2-4 decoder output ports sa, sb, sc and sd; when a logic control voltage level is high (or low), a corresponding bias current control circuit 220 is switched ON (or OFF). Thus in this embodiment, the logic control voltage levels at sa, sb, sc and sd determine which input differential RF signal received at the multiplexer is selected as basis for the multiplexer output signal, which is fed to the back-end amplifier A2 150 and output from the output port OUT of the back-end amplifier A2 after further amplification.

Table 1 shows the logic control truth table of the present embodiment that relates input logic control signals at input ports s0, s1 to corresponding output signals at the output port OUT:

TABLE 1

Truth table of input logic control signals at input ports s0, s1 and the corresponding output signals at the output port OUT

| s1 | s0 | sa | sb | sc | sd | OUT |
|----|----|----|----|----|----|-----|
| 0 | 0 | 1 | 0 | 0 | 0 | x1 selected |
| 0 | 1 | 0 | 1 | 0 | 0 | x2 selected |
| 1 | 0 | 0 | 0 | 1 | 0 | x4 selected |
| 1 | 1 | 0 | 0 | 0 | 1 | x8 selected |

Table 2 shows the logic control truth table of the present embodiment that relates input control signals at input ports s0, s1 to the ON or OFF states of the frequency multipliers:

TABLE 2

Truth table of input logic control signals at input ports s0, s1 and the corresponding ON or OFF states of the frequency multipliers

| s1 | s0 | pd0 | pd1 | pd2 | OUT |
|----|----|-----|-----|-----|-----|
| 0 | 0 | 1 | 1 | 1 | x1 selected |
| 0 | 1 | 0 | 1 | 1 | x2 selected |

TABLE 2-continued

Truth table of input logic control signals at input ports s0, s1 and the corresponding ON or OFF states of the frequency multipliers

| s1 | s0 | pd0 | pd1 | pd2 | OUT |
|----|----|-----|-----|-----|-----|
| 1 | 0 | 0 | 0 | 1 | x4 selected |
| 1 | 1 | 0 | 0 | 0 | x8 selected |

Further, in the implementation of present embodiment, each differential pair conducts a different current value, for example, the differential RF signal d/nd has the highest frequency among all differential input RF signals, the size of the NPN transistor Qd3 and a corresponding biasing resistor REd can be optimized to conduct a largest current value for the corresponding differential pair when switched ON, and therefore to improve the overall performance and power consumption for the multiplexer based frequency extender.

In the present embodiment, assuming the frequency multiplier provides ×1, ×2, ×4 and ×8 options, if an RF input signal fed to the invented frequency extender has a frequency range of 2 to 4 GHz, the frequency extender output RF signal can cover an extended frequency range from 2 to 32 GHz.

Embodiment 2

Figure 3:
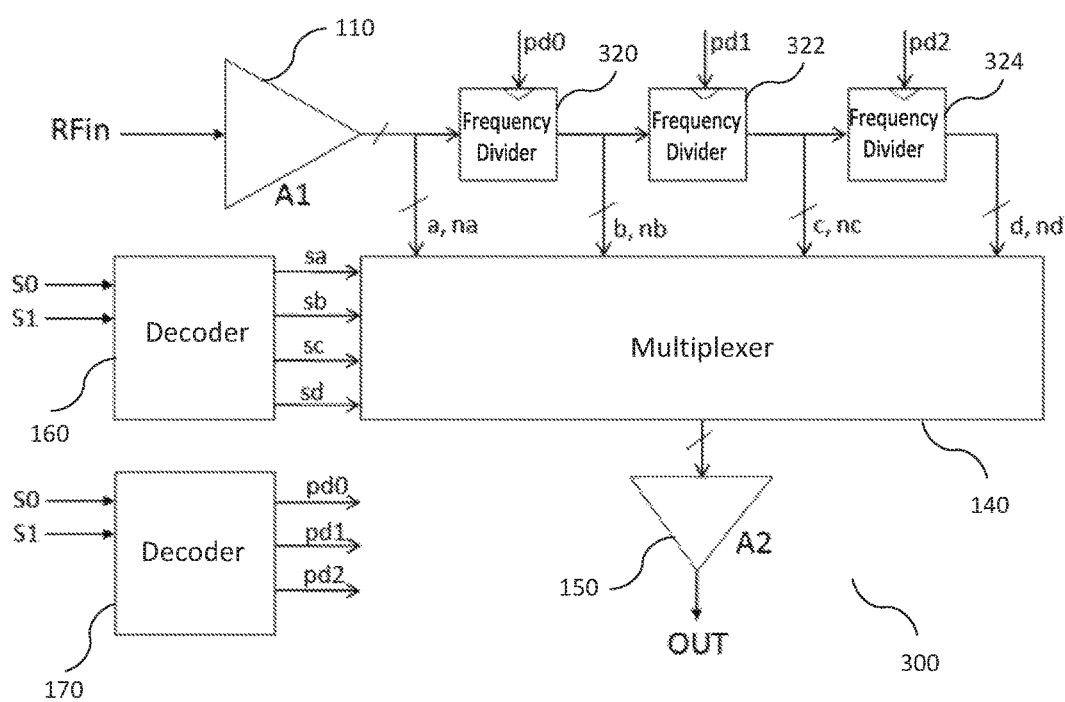
FIG. 3 is a block diagram of a second embodiment of the present invention.

As shown in FIG. 3, the difference between the present embodiment 300 and embodiment 1 is: three frequency dividers 320, 322 and 324 in replacement of three frequency multipliers 120, 122 and 124.

Table 3 shows the logic control truth table of the present embodiment that relates input logic control signals at input ports s0, s1 to corresponding output signals at the output port OUT:

TABLE 3

Truth table of input logic control signals at input ports s0, s1 and the corresponding output signals at the output port OUT

| s1 | s0 | sa | sb | sc | sd | OUT |
|----|----|----|----|----|----|-----|
| 0 | 0 | 1 | 0 | 0 | 0 | /1 selected |
| 0 | 1 | 0 | 1 | 0 | 0 | /2 selected |
| 1 | 0 | 0 | 0 | 1 | 0 | /4 selected |
| 1 | 1 | 0 | 0 | 0 | 1 | /8 selected |

Table 4 shows the logic control truth table of the present embodiment that relates input control signals at input ports s0, s1 to the ON or OFF states of the frequency dividers:

TABLE 4

Truth table of input logic control signals at input ports s0, s1 and the corresponding ON or OFF states of the frequency dividers

| s1 | s0 | pd0 | pd1 | pd2 | OUT |
|----|----|-----|-----|-----|-----|
| 0 | 0 | 1 | 1 | 1 | /1 selected |
| 0 | 1 | 0 | 1 | 1 | /2 selected |
| 1 | 0 | 0 | 0 | 1 | /4 selected |
| 1 | 1 | 0 | 0 | 0 | /8 selected |

Further, in the implementation of present embodiment, each differential pair conducts a different current value, for example, the differential RF signal a/na has the highest frequency among all differential input RF signals, the size of the NPN transistor Qa3 and a corresponding biasing resistor REa can be optimized to conduct a largest current value for the corresponding differential pair when switched ON, and therefore to improve the overall performance and power consumption for the multiplexer based frequency extender.

In the present embodiment, assuming the frequency divider provides /1, /2, /4 and /8 options, if an RF input signal fed to the invented frequency extender has a frequency range of 10 to 20 GHz, the frequency extender output RF signal can cover an extended frequency range from 1.25 to 20 GHz.

The above said detailed descriptions of the preferred embodiments have further elaborated the purposes, technical scheme and beneficial effects of the invention. It should be understood that, all the above said are only the detailed descriptions of the preferred embodiments of the invention, and shall not constitute a restriction on the protection scope of the invention. Any amendments, substitutions to the same object and improvements that are within the spirits and principles of the invention shall fall within the protection scope of the invention.

The invention claimed is:

1. A multiplexer based frequency extender comprising:
a preamplifier that receives a radio frequency (RF) input signal having an input frequency and that outputs a pre-amplified RF signal;
at least one frequency multiplier coupled in series with the preamplifier, the at least one frequency multiplier receives the pre-amplified RF signal and outputs at least one frequency-multiplied RF output signal;
a multiplexer coupled to receive the pre-amplified RF signal and the at least one frequency-multiplied RF signal and comprising a plurality of differential circuits and corresponding bias current control circuits, the corresponding bias current control circuits control the plurality of differential circuits such that a path through the multiplexer is defined to select the pre-amplified RF signal or the at least one frequency-multiplied RF output signal and the multiplexer outputs a multiplexer output signal based on the selected pre-amplified RF signal or the at least one frequency-multiplied signal;
wherein each bias current control circuit comprises a NPN transistor and a NMOS field effect transistor (FET), the NPN transistor has a base coupled to a DC bias voltage source, a collector coupled to the differential circuit, and an emitter coupled to a drain of the NMOS FET via a biasing resistor, the NMOS FET has a source grounded and a gate coupled to a logic trigger input via a resistor, the logic trigger input controls ON or OFF of the NMOS FET with a logic high voltage or a logic low voltage.

2. The multiplexer based frequency extender of claim 1, wherein:
each of the plurality of differential circuits comprises of a NPN transistor pair having both emitters tied together and coupled to one corresponding bias current control circuit;
the pre-amplified RF signal and the at least one frequency-multiplied RF output signal are differential signals input to the multiplexer via corresponding differential input ports, each differential input port having two differential signal lines coupled to bases of a corresponding NPN transistor pair respectively; and
the multiplexer output signal is output from a differential output port having two differential signal lines coupled to collectors of each NPN transistor pairs, each differential signal line at the output port couples to a DC voltage source via a resistor.

3. The multiplexer based frequency extender of claim 2, wherein each differential signal line at the output port of the multiplexer couples to the DC voltage source via the load resistor and an inductor.

4. The multiplexer based frequency extender of claim 1 further comprises a first decoder to generate logic trigger input signals for controlling each bias current control circuit of the multiplexer, and a second decoder to generates logic control signals for controlling ON or OFF states of the at least one frequency multiplier.

5. The multiplexer based frequency extender of claim 1 further comprising a back-end amplifier coupled to receive the multiplexer output signal for amplifying the multiplexer output signal.

6. The multiplexer based frequency extender of claim 1, wherein the preamplifier comprises two fan-out buffers to output the pre-amplified RF signal to at least one frequency multiplier and one input port of the multiplexer respectively.

7. The multiplexer based frequency extender claim 1, wherein the multiplexer has four input ports, the frequency extender has three frequency multipliers coupled in series to output three frequency multiplied signals.

8. The multiplexer based frequency extender of claim 7, wherein the four input ports of the multiplexer are coupled to receive the three frequency-multiplied signals and the pre-amplified RF signal respectively.

9. A multiplexer based frequency extender comprising:
a preamplifier that receives a radio frequency (RF) input signal having an input frequency and that outputs a pre-amplified RF signal;
at least one frequency divider coupled in series with the preamplifier, the at least one frequency divider receives the pre-amplified RF signal and outputs at least one frequency-divided RF output signal;
a multiplexer coupled to receive the pre-amplified RF signal and the at least one frequency-divided RF signal and comprising a plurality of differential circuits and corresponding bias current control circuits, the corresponding bias current control circuits control the plurality of differential circuits such that a path through the multiplexer is defined to select one signal from the pre-amplified RF signal or the at least one frequency-divided RF output signal and the multiplexer outputs a multiplexer output signal based on the selected signal;
wherein the bias current control circuit comprises a NPN transistor and a NMOS field effect transistor (FET), the NPN transistor has a base coupled to a DC bias voltage source, a collector coupled to the differential circuit, and an emitter coupled to a drain of the NMOS FET via a biasing resistor, the NMOS FET has a source grounded and a gate coupled to receive a logic trigger input via a resistor, the logic trigger input controls ON or OFF of the NMOS FET with a logic high voltage or a logic low voltage.

10. The multiplexer based frequency extender of claim 9, wherein:
each of the plurality of differential circuits comprises of a NPN transistor pair having both emitters tied together and coupled to one corresponding bias current control circuit;
the pre-amplified RF signal and the at least one frequency-divided RF output signal are differential signals input to the multiplexer via corresponding differential input ports, each differential input port having two differential signal lines coupled to bases of a corresponding NPN transistor pair respectively; and the multiplexer output signal is output from a differential output port having two differential signal lines coupled to collectors of each NPN transistor pairs, each differential signal line at the output port couples to a DC voltage source via a resistor.

11. The multiplexer based frequency extender of claim 10, wherein an inductor is coupled in series between the resistor and the DC voltage source for each differential signal lines at the output port of the multiplexer.

12. The multiplexer based frequency extender of claim 9 further comprises a first decoder which generates the logic trigger input signal for controlling each of the bias current control circuits and a second decoder which generates logic control signals to turn ON or OFF the at least one frequency divider.

13. The multiplexer based frequency extender of claim 9 further comprising a back-end amplifier coupled to receive the multiplexer output signal for amplifying the multiplexer output signal.

14. A multiplexer comprising:
a plurality of differential circuits to receive a plurality of differential signals having different frequencies respectively; and
a plurality of bias current control circuits coupled to the plurality of differential circuits respectively to enable or disable corresponding differential circuits such that a path through the multiplexer is defined to select one differential signal from the plurality of differential signals and the multiplexer outputs an output signal via an output port, the output signal being differentially amplified from the selected differential signal, the plurality of bias current control circuits enables the plurality of differential circuits to have different current conducting capacities, wherein the differential circuit receiving the differential signal with highest frequency has the largest current conducting capacity.

15. The multiplexer of claim 14 wherein each differential circuit comprises a pair of NPN transistors with transistor base terminals coupled to a corresponding differential input port and transistor collector terminals coupled to the output port.

16. The multiplexer of claim 15 wherein the output port is a differential port having two signal lines, each signal line coupled to a DC voltage source via a resistor and a inductor.

17. The multiplexer of claim 16 wherein each bias current control circuit comprises a NPN transistor with a collector coupled to one corresponding differential circuit and a field effect transistor (FET) coupled to the NPN transistor in series via a biasing resistor.

18. The multiplexer of claim 17 further comprising a decoder coupled to a gate of the FET of each bias current control circuit, the decoder receives a selection input signal and outputs logic trigger input signals to control ON or OFF states of each bias current control circuit.

* * * * *